United States Patent
Udrea et al.

(10) Patent No.: US 8,174,069 B2
(45) Date of Patent: May 8, 2012

(54) POWER SEMICONDUCTOR DEVICE AND A METHOD OF FORMING A POWER SEMICONDUCTOR DEVICE

(75) Inventors: Florin Udrea, Cambridge (GB); Vasantha Pathirana, Cambridge (GB); Tanya Trajkovic, Cambridge (GB); Nishad Udugampola, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 616 days.

(21) Appl. No.: 12/186,231

(22) Filed: Aug. 5, 2008

(65) Prior Publication Data
US 2010/0032712 A1    Feb. 11, 2010

(51) Int. Cl.
*H01L 29/94* (2006.01)
(52) U.S. Cl. . 257/341; 257/343; 257/347; 257/E29.256; 257/E29.261; 438/149; 438/479; 438/517
(58) Field of Classification Search .................. 257/341, 257/343, 347, E29.256, E29.258, E29.261, 257/E29.295; 438/149, 479, 517
See application file for complete search history.

(56) References Cited

U.S. PATENT DOCUMENTS

| | | | |
|---|---|---|---|
| 5,202,750 A | 4/1993 | Gough | |
| 6,703,684 B2 * | 3/2004 | Udrea et al. | 257/548 |
| 6,768,180 B2 * | 7/2004 | Salama et al. | 257/401 |
| 2006/0067137 A1 | 3/2006 | Udrea | |
| 2008/0182394 A1 * | 7/2008 | Yang et al. | 438/510 |

FOREIGN PATENT DOCUMENTS

| | | |
|---|---|---|
| WO | 2006-024857 A1 | 3/2006 |
| WO | 02/25700 A2 | 8/2008 |

* cited by examiner

*Primary Examiner* — Matthew E Warren
(74) *Attorney, Agent, or Firm* — Pillsbury Winthrop Shaw Pittman LLP

(57) ABSTRACT

A power semiconductor device has a top surface and an opposed bottom surface below a part of which is a thick portion of semiconductor substrate. At least a portion of a drift region of the device has either no or only a thin portion of semiconductor substrate positioned thereunder. The top surface has a high voltage terminal and a low voltage terminal connected thereto to allow a voltage to be applied laterally across the drift region. At least two MOS (metal-oxide-semiconductor) gates are provided on the top surface. The device has at least one relatively highly doped region at its top surface extending between and in contact with said first and second MOS gates. The device has improved protection against triggering of parasitic transistors or latch-up without the on-state voltage drop or switching speed being compromised.

18 Claims, 14 Drawing Sheets

POWER SEMICONDUCTOR DEVICE AND A METHOD OF FORMING A POWER SEMICONDUCTOR DEVICE

The present invention relates to a power semiconductor device and to a method of forming a power semiconductor device.

The present invention is particularly concerned with high voltage semiconductor devices which can be used in power integrated circuits and is particularly concerned with lateral field-effect transistors, such as power LDMOSFETs, lateral insulated gate bipolar transistors (LIGBTs) and other types of power devices such as diodes, transistors and thyristors.

Power devices operated in integrated circuits typically operate with a voltage in the range 20V to 1.2 kV and typically higher than 30V or 50V or so. Power devices typically operate with a current in the range 10 mA to 50 A and typically higher than 0.1 A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control and power supplies to RF and microwave circuits and telecommunication systems.

High voltage semiconductor devices have incorporated within the body of the device a high voltage junction that is responsible for blocking the voltage. This junction includes a relatively lowly doped semiconductor layer which withstands the largest portion of the voltage across the main terminals when the device is in the off-state and operating in the voltage blocking mode. This layer is commonly referred to as the "drift region" or "drift layer" and is partially or fully depleted of minority carriers during this operating mode.

Lateral devices in integrated circuits have the main terminals (variously called the anode/cathode, drain/source and emitter/collector) and the control terminals (termed the gate or base) placed at the surface of the device in order to be easily accessible. The anode/drain/emitter is the high voltage terminal and the cathode/source/collector is the low voltage terminal. In power ICs, such devices are often monolithically integrated with CMOS-type or BiCMOS-type low voltage/low power circuits. It is desirable that one or several high voltage/power devices be integrated within the same chip.

Our U.S. Pat. No. 6,703,684 and WO-A-02/25700 and related patents and patent applications, the entire contents of which are hereby incorporated by reference, disclose a technique to allow a high breakdown voltage to be supported within a drift region embedded in a thin "membrane". This technique can be mainly applied (though is not restricted) to SOI (silicon-on-oxide) structures whereby the buried oxide acts as an effective etch stop to define accurately a membrane in the drift region of a power device by removing entirely the silicon substrate under at least part of the drift region. The use of the membrane technology not only allows a significant increase in the avalanche breakdown but also removes the undesirable punch-through present in thin silicon LIGBTs. In addition, the membrane technology helps to reduce the cross-talk and increase the switching speed by considerably reducing the output capacitance.

Placing a power device on the membrane, as disclosed in the above-mentioned patents and patent applications, may nevertheless lead to undesirable self-heating effects. A high temperature gradient is established between the centre of the membrane and its periphery, in essence because there is no substrate below the membrane to conduct heat away. Increasing the static and dynamic power during operation may result in hotspots occurring at the centre of the membrane. In addition, scaling such devices for different output power levels will be an issue. For example, increasing the current capability of the device (for the same breakdown) requires increasing its active area. This can result in an undesirable increase in the temperature at the centre of the membrane and as a result a large temperature gradient between the centre of the device and the edge of the device. A power device may comprise several identical cells or fingers and since a large membrane will cause a temperature gradient from the centre of the cell to the edges, these cells will carry unbalanced currents in static and dynamic conditions, possibly leading to early failures and limiting considerably the use of the device.

In addition to the thermal drawback, by increasing the membrane size, the mechanical resistance of the structure is reduced considerably. This has severe implications on the processing, handling and packaging of such devices as well as yield and ultimately reliability.

In our WO-A-2006/024857, US-A-2006/0067137 and related patent applications, the entire contents of which are hereby incorporated by reference, an arrangement is disclosed in which instead of having a single membrane for the power device, multiple membranes are used with the low voltage side (i.e. source side) of the device being placed on silicon pillars (i.e. outside the membranes) while the high voltage side (i.e. drain side) is placed on the multiple membranes. Ideally most of the drift region is placed within the membranes so that the electric field is uniform and hence delivering the required breakdown, while the MOS channel of the control gate stays outside the membranes to protect it against high temperatures, and concomitantly reduce its exposure to mechanical stress. However, placing the MOS channel too far outside the edge of the membranes means increasing the size of the drift region and hence increasing the on-state and switching losses without benefiting from any enhancements in the breakdown ability of the device.

In short therefore, in such membrane devices, there is a trade-off between protecting the MOS channel from becoming hot and exposing it to mechanical stress (which is severe in the proximity of the membrane edge) and the overall on-state/switching performance of the device.

The term "membrane" as used herein generally refers to a thin region, which either consists of a semiconductor layer or which is formed of several layers at least one of which is a semiconductor layer. The membrane may be mechanically clamped to the semiconductor substrate of the device only at its periphery. There is for example no direct connection of a semiconductor substrate to the top or the bottom of the membrane.

Problems associated with the MOS channel running at a higher temperature include:
(i) reduced charge carrier mobility, which increases the on-state losses and lowers the saturation current, which limits the maximum current capability of the device;
(ii) increased parasitic bipolar npn action and possibility of static latch-up, which leads to a reduction in the FBSOA (Forward Biased Safe Operating Area);
(iii) higher probability of dynamic latch-up. This limits the RBSOA (Reverse Biased Safe Operating Area) and also affects the reliability of the device switching in a real system. Higher frequencies and higher inductive loads can worsen this effect;
(iv) reliability issues. NBTI (Negative Bias Temperature Instability), TDDB (Time Dependent Dielectric Breakdown), gate breakdown, EM (Electromigration) all obey Arrhenius law which implies the time to failure varies exponentially with (Ea/kT) where Ea is the activation energy for a particular failure mechanism, k is the Boltzmann constant and T is the temperature. Lowering the temperature of the MOS channel ultimately improves the reliability of the device.

Problems associated with the channel being too close to the edge of the membrane include:
(i) the edge of the membrane is exposed to high mechanical stresses. As the membrane is formed during back-side etching, the edges and corners of the membrane encounter stress, which can increase during packaging and/or during the operation of the device at high temperature;
(ii) the edge of the membrane can be subject to damage caused by the dry etching typically used to remove substrate under the membrane(s). Parasitic charge or defects can accumulate at the edges and these can have an adverse effect on the yield and reliability of the MOS channel and therefore on the overall reliability of the device.

Moreover, even if the channel is placed at a certain distance from the edge of the membrane (which may typically be say 5 microns or so), the combined effects of over-etch and misalignment, which vary across a single silicon wafer or from wafer to wafer or indeed from batch to batch, means that the MOS channel can end up on the membrane or very close to the edge membrane. Since the MOS channel is the most sensitive part, this leads to yield loss, poorer performance and reduced SOA (Safe Operating Area) and reliability.

Reference is also made to so-called emitter switched thyristors (ESTs) as disclosed in for example IEEE ELECTRON DEVICE LETTERS, VOL 11, NO. 2, FEBRUARY 1990, p. 75; U.S. Pat. No. 5,202,750; and IEEE International Symposium on Power Semiconductor Devices and Integrated Circuits, ISPSD 1993 conference, p. 264. In each device disclosed, a floating n+ emitter is present which latches up when the hole current flows under it through the p-well. The n+ floating emitter together with the p-well, n drift region and the p+ anode region form a thyristor that leads to higher plasma (excess charge) concentration in the drift region and therefore lower on-state losses compared to what is achieved by an LIGBT.

According to a first aspect of the present invention, there is provided a power semiconductor device on a semiconductor substrate, the device having a top surface and an opposed bottom surface below a part of which is a relatively thick portion of the semiconductor substrate, the power semiconductor device having a drift region which is relatively lowly doped, at least a portion of the drift region having either no semiconductor substrate positioned thereunder or a relatively thin portion of the semiconductor substrate thereunder, the top surface of the device having a high voltage terminal and a low voltage terminal connected directly or indirectly thereto to allow a voltage to be applied laterally across the drift region, the drift region having a first edge located proximate the low voltage terminal and a second edge located proximate the high voltage terminal, the device having at least two MOS (metal-oxide-semiconductor) gates on the top surface of the device for controlling current level in the device during on-state of the device and for controlling switching of the device, wherein a first of the MOS gates is located over the first edge of the drift region and in contact with the drift region and a second of the MOS gates is located between the low voltage terminal and the first MOS gate, the device having at least one relatively highly doped region at its top surface extending between and in contact with said first and second MOS gates, wherein if the inversion layer channels that are formed under said first and second MOS gates on operation of said first and second MOS gates are electron channels then the or each relatively highly doped region is n type and if the inversion layer channels that are formed under said first and second MOS gates on operation of said first and second MOS gates are hole channels then the or each relatively highly doped region is p type.

In various embodiments, devices according to the present invention have improved protection against triggering of parasitic transistors or latch-up without the on-state voltage drop or switching speed being compromised compared to the known membrane devices discussed above. The preferred devices can also enhance the on-state performance and improve both the Forward Biased Safe Operating Area (FB-SOA) and Reverse Biased Safe Operating Area (RBSOA). Ultimately, by allowing lower temperatures in the MOS channel overall, which is one of the most sensitive areas of the power device, the overall reliability of membrane devices is improved. Moreover, devices according to the present invention tend to be more robust against over-etch of the substrate, which may be used to form the membrane(s), and against back-to-front misalignment during manufacture, resulting in increased yields compared to that of known membrane devices discussed above. In a sense, the or each MOS gate that is nearer the drift region "shields" the other MOS gate or gates that are further away from the drift region against loss of gate control, improving the immunity of the device to latch up and increasing the safe operating area of the device.

In effect, the inversion layer channels under the MOS gates are electrically connected in series with each other by the relatively highly doped region that extends between the first and second MOS gates. The inversion layer channels are typically controlled in practice by the same gate voltage. However, because of their position relative to the first edge of the drift region, the inversion layer channels operate at slightly different temperatures, with the channel closer to the first edge being subjected to higher temperatures. The first edge of the drift region may be close to or generally coincident or coplanar with the boundary between the relatively thick portion of the semiconductor substrate and the part where there is either no semiconductor substrate or only a relatively thin portion of the semiconductor substrate.

In an embodiment, the power semiconductor device comprises a single gate terminal connected to said first and second MOS gates for allowing the same gate voltage to be applied simultaneously to said first and second MOS gates. This facilitates the provision of the same gate voltage to each of the MOS gates.

In an embodiment, the power semiconductor device comprises a further doped region at the top surface of the device between and in contact with said first and second MOS gates, the further doped region being of the opposite conductivity type to the relatively highly doped region that extends between said first and second MOS gates. The further doped region of the opposite conductivity type may be relatively lowly doped, in which case, in an appropriately arranged device, the relatively highly doped region that extends between said first and second MOS gates can act as a charge carrier emitter, leading to higher conductivity modulation and as a result lower on-state voltage drop. This is similar to the arrangement achieved in the EST devices referred to above. As an alternative, the further doped region of the opposite conductivity type may be relatively highly doped, in which case the relatively highly doped region that extends between said first and second MOS gates does not normally act as a charge carrier emitter.

In an embodiment, the device comprises a second relatively highly doped region at the top surface of the device between and in contact with said first and second MOS gates, said further relatively highly doped region being of the same conductivity type as the first relatively highly doped region that extends between said first and second MOS gates, said further doped region of the opposite conductivity type being positioned between the first and second relatively highly doped regions that extend between said first and second MOS gates.

In an embodiment, said portion of the drift region has no semiconductor substrate positioned thereunder, and the device comprises an electrically insulating layer between said part of the device and said relatively thick portion of the semiconductor substrate and under said at least a portion of the drift region. The electrically insulating layer may be a buried oxide layer.

Preferably, the drift region and the relatively highly doped region that extends between said first and second MOS gates are each doped with a first conductivity type, and the device comprises a well of the second conductivity type, the relatively highly doped region that extends between said first and second MOS gates being provided in the well, the well extending to the top surface of the device under the MOS gates and extending to the first edge of the drift region. The well and the drift region in operation form a reverse-biased junction, which in the blocking mode supports the voltage across the main terminals. The well is intended to protect the device against punch-through during the blocking mode (i.e. the depletion region developed in the well at breakdown is smaller than the length of the well).

In an embodiment, the device is an LDMOSFET (lateral diffusion MOS transistor), and the drift region and the relatively highly doped region that extends between said first and second MOS gates are each doped with a first conductivity type, and the device comprises a relatively highly doped region of the first conductivity type under the high voltage terminal, a relatively highly doped region of the first conductivity type under the low voltage terminal, a relatively highly doped region of the second conductivity type under the low voltage terminal, and a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

In an embodiment, the device is an LIGBT (lateral insulated gate bipolar transistor), and the drift region and the relatively highly doped region that extends between said first and second MOS gates are each doped with a first conductivity type, and the device comprises a relatively highly doped region of the second conductivity type under the high voltage terminal, a relatively highly doped region of the first conductivity type under the low voltage terminal, a relatively highly doped region of the second conductivity type under the low voltage terminal, and a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

According to a second aspect of the present invention, there is provided a method of forming a power semiconductor device on a semiconductor substrate, the device having a top surface and an opposed bottom surface below a part of which is a relatively thick portion of the semiconductor substrate, the method comprising forming, on the substrate, the power semiconductor device with a drift region which is relatively lowly doped, removing substrate below at least a portion of the drift region so that said at least a portion of the drift region has either no semiconductor substrate positioned thereunder or a relatively thin portion of the semiconductor substrate thereunder, connecting a high voltage terminal and a low voltage terminal directly or indirectly to the top surface of the device to allow a voltage to be applied laterally across the drift region, the drift region having a first edge located proximate the low voltage terminal and a second-edge located proximate the high voltage terminal, the method further comprising forming at least two MOS (metal-oxide-semiconductor) gates on the top surface of the device for controlling current level in the device during on-state of the device and for controlling switching of the device, wherein a first of the MOS gates is located over the first edge of the drift region and in contact with the drift region and a second of the MOS gates is located between the low voltage terminal and the first MOS gate, and forming at least one relatively highly doped region at the top surface of the device so as to extend between and in contact with said first and second MOS gates, wherein if the inversion layer channels that are formed under said first and second MOS gates on operation of said first and second MOS gates are electron channels then the or each relatively highly doped region is n type and if the inversion layer channels that are formed under said first and second MOS gates on operation of said first and second MOS gates are hole channels then the or each relatively highly doped region is p type.

In an embodiment, the method comprises connecting a single gate terminal to said first and second MOS gates for allowing the same gate voltage to be applied simultaneously to said first and second MOS gates.

In an embodiment, the method comprises providing a further doped region at the top surface of the device between and in contact with said first and second MOS gates, the further doped region being of the opposite conductivity type to the relatively highly doped region that extends between said first and second MOS gates.

In an embodiment, the method comprises providing a second relatively highly doped region at the top surface of the device between and in contact with said first and second MOS gates, said further relatively highly doped region being of the same conductivity type as the first relatively highly doped region that extends between said first and second MOS gates, said further doped region of the opposite conductivity type being positioned between the first and second relatively highly doped regions that extend between said first and second MOS gates.

In an embodiment, the removing of the substrate leaves said portion of the drift region with no semiconductor substrate positioned thereunder, and the method comprises forming an electrically insulating layer between said part of the device and said relatively thick portion of the semiconductor substrate and under said at least a portion of the drift region.

In an embodiment, the drift region and the relatively highly doped region that extends between said first and second MOS gates are each doped with a first conductivity type, and the method comprises forming a well of the second conductivity type, the relatively highly doped region that extends between said first and second MOS gates being provided in the well, the well extending to the top surface of the device under the MOS gates and extending to the first edge of the drift region.

In an embodiment, the device is an LDMOSFET (lateral diffusion MOS transistor), and the drift region and the relatively highly doped region that extends between said first and second MOS gates are each doped with a first conductivity type, and the method comprises forming a relatively highly doped region of the first conductivity type under the high voltage terminal, forming a relatively highly doped region of the first conductivity type under the low voltage terminal, forming a relatively highly doped region of the second conductivity type under the low voltage terminal, and forming a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

In an embodiment, the relatively highly doped region that extends between said first and second MOS gates is formed in the same fabrication step as at least one of the relatively highly doped region of the first conductivity type under the high voltage terminal and the relatively highly doped region of the first conductivity type under the low voltage terminal.

In an embodiment, the device is an LIGBT (lateral insulated gate bipolar transistor), and the drift region and the relatively highly doped region that extends between said first and second MOS gates are each doped with a first conductivity type, and the method comprises forming a relatively highly doped region of the second conductivity type under the high voltage terminal, forming a relatively highly doped region of the first conductivity type under the low voltage terminal, forming a relatively highly doped region of the second conductivity type under the low voltage terminal, and forming a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

In an embodiment, the relatively highly doped region that extends between said first and second MOS gates is formed in the same fabrication step as the relatively highly doped region of the first conductivity type under the low voltage terminal.

Embodiments of the present invention will now be described by way of example with reference to the accompanying drawings, in which.

Figure 4:
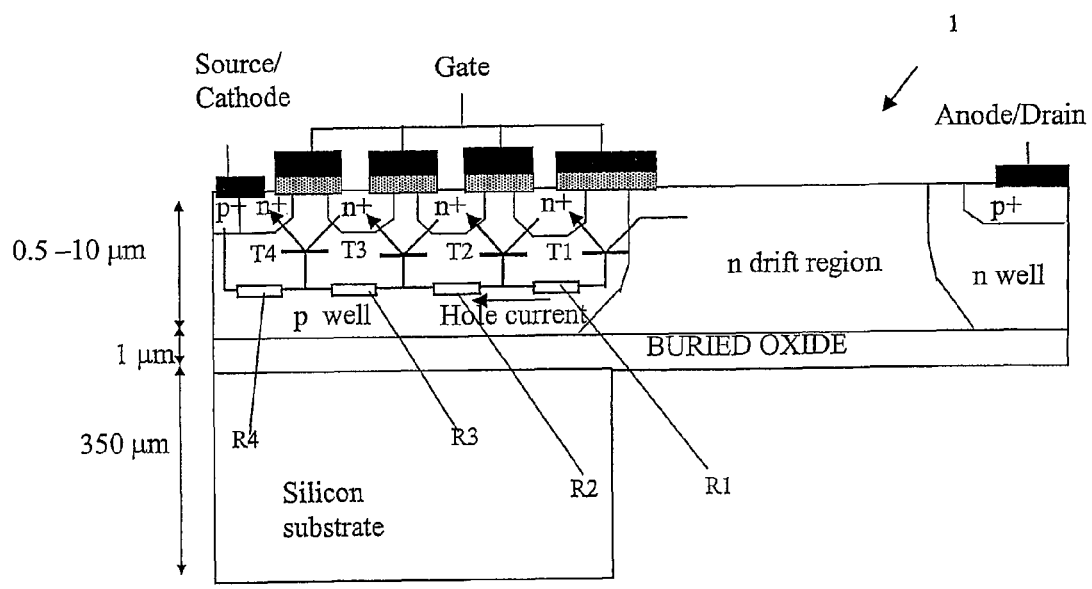
FIG. 4 is a view corresponding to FIG. 3 in which the equivalent circuit is schematically illustrated.
Figure 7:
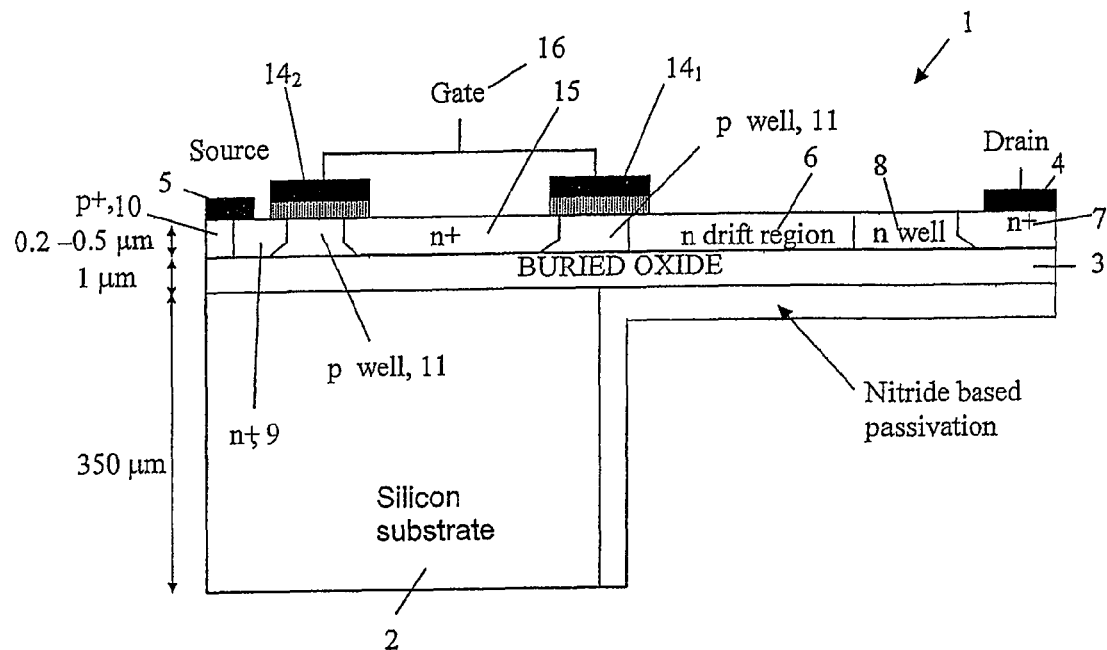
Figure 8:
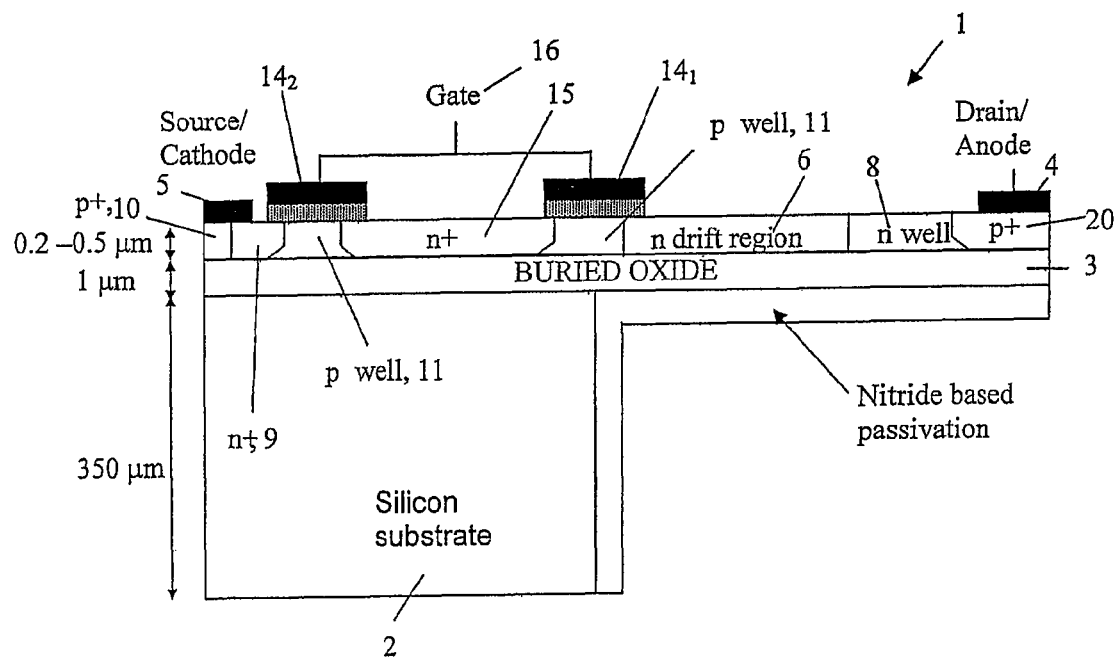
Figure 9:
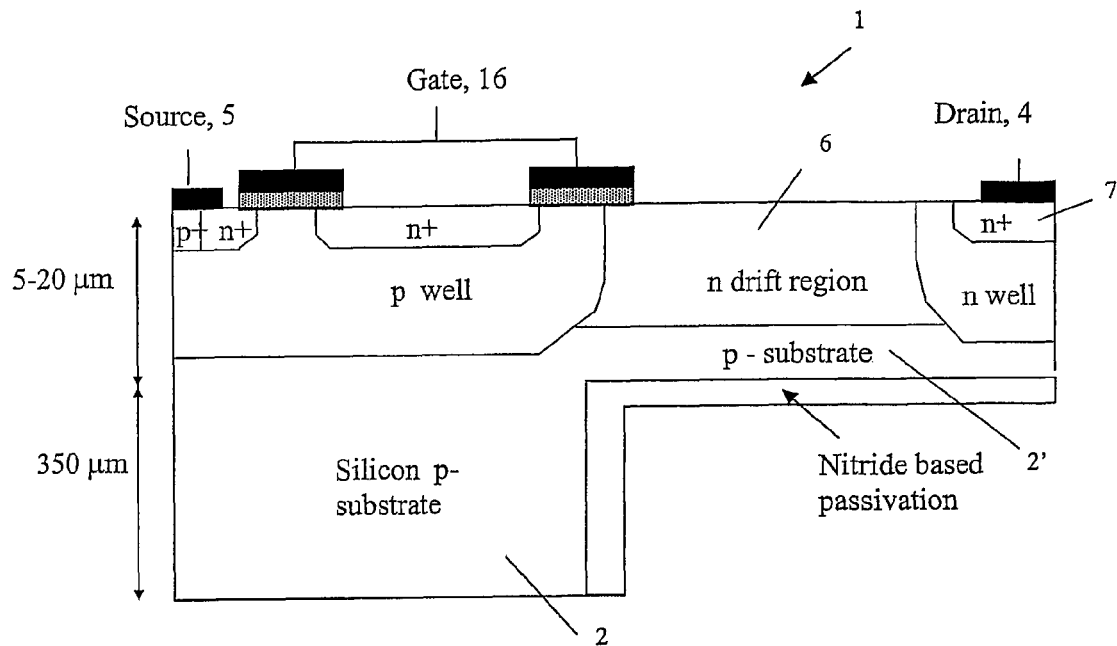
Figure 10:
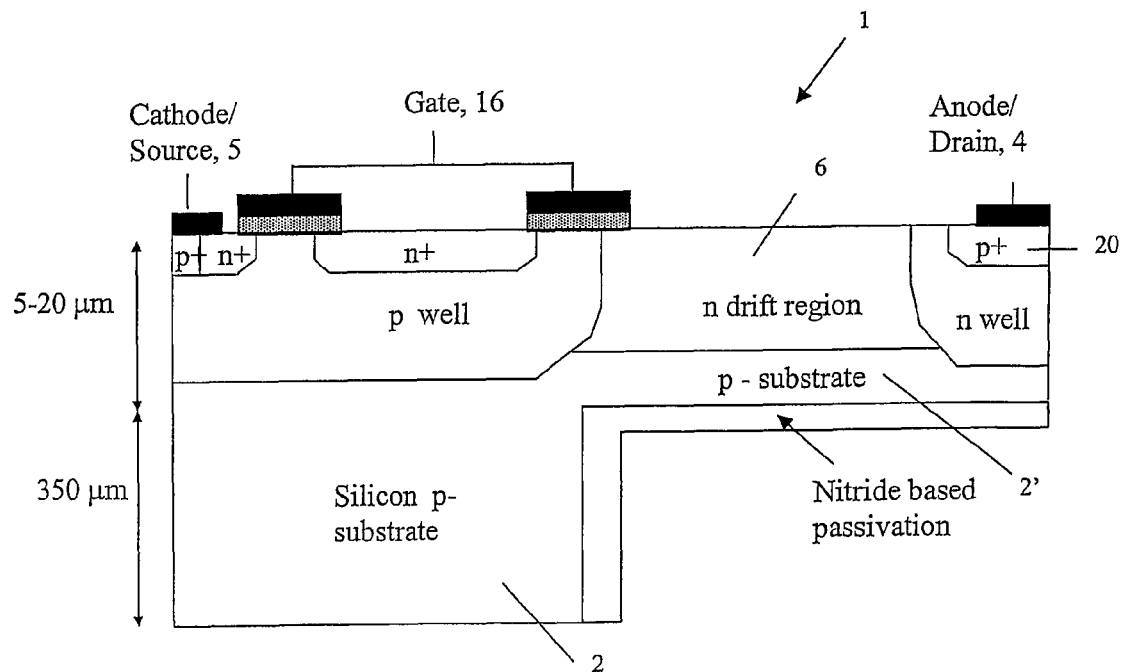
Figure 11:
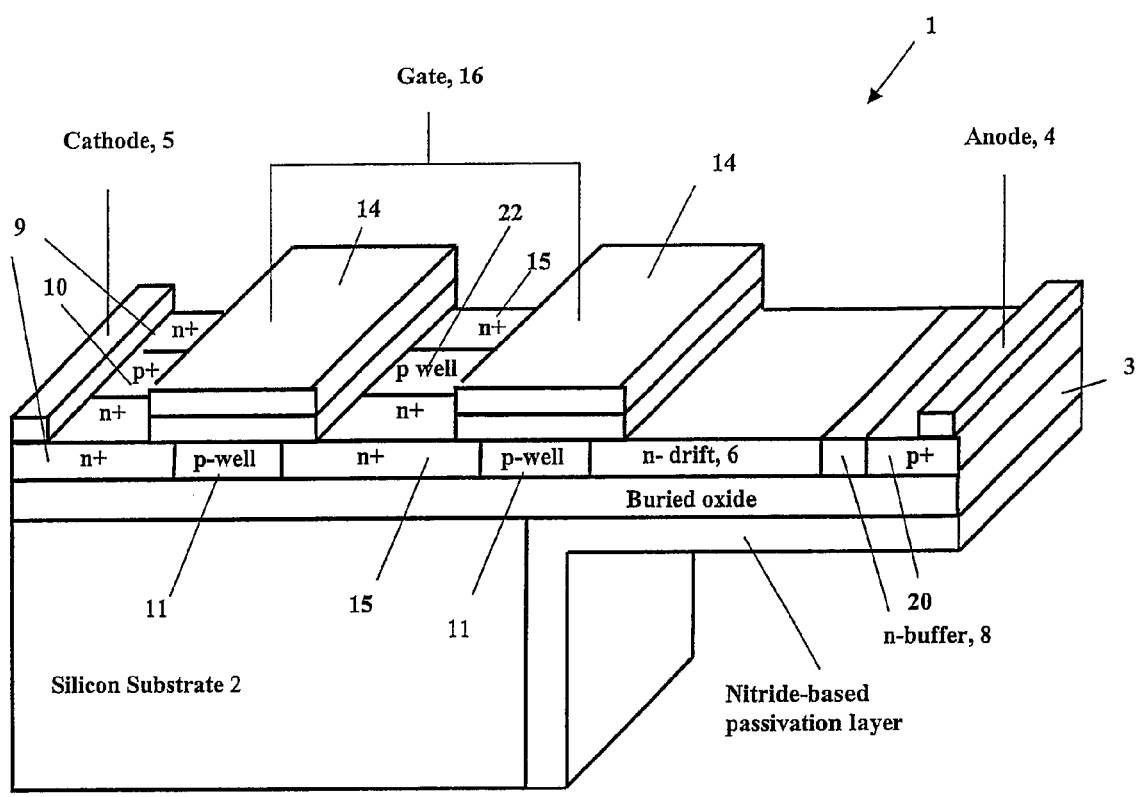
Figure 12:
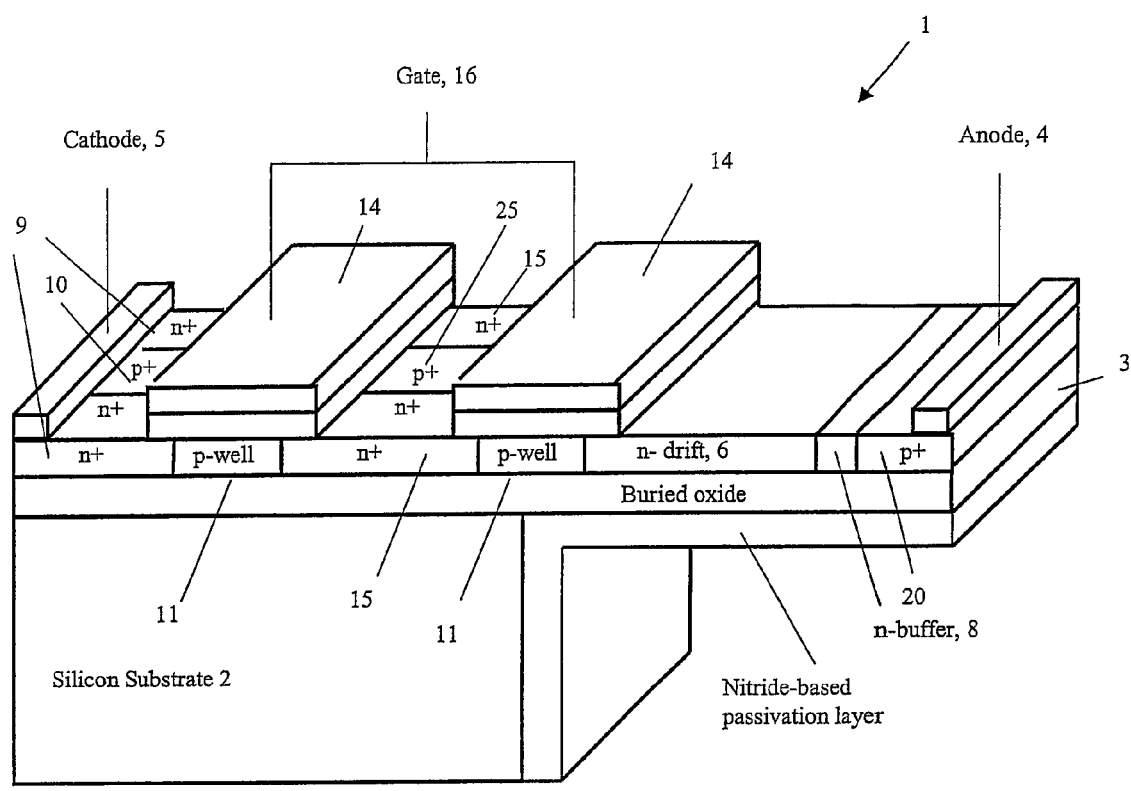
Figure 13:
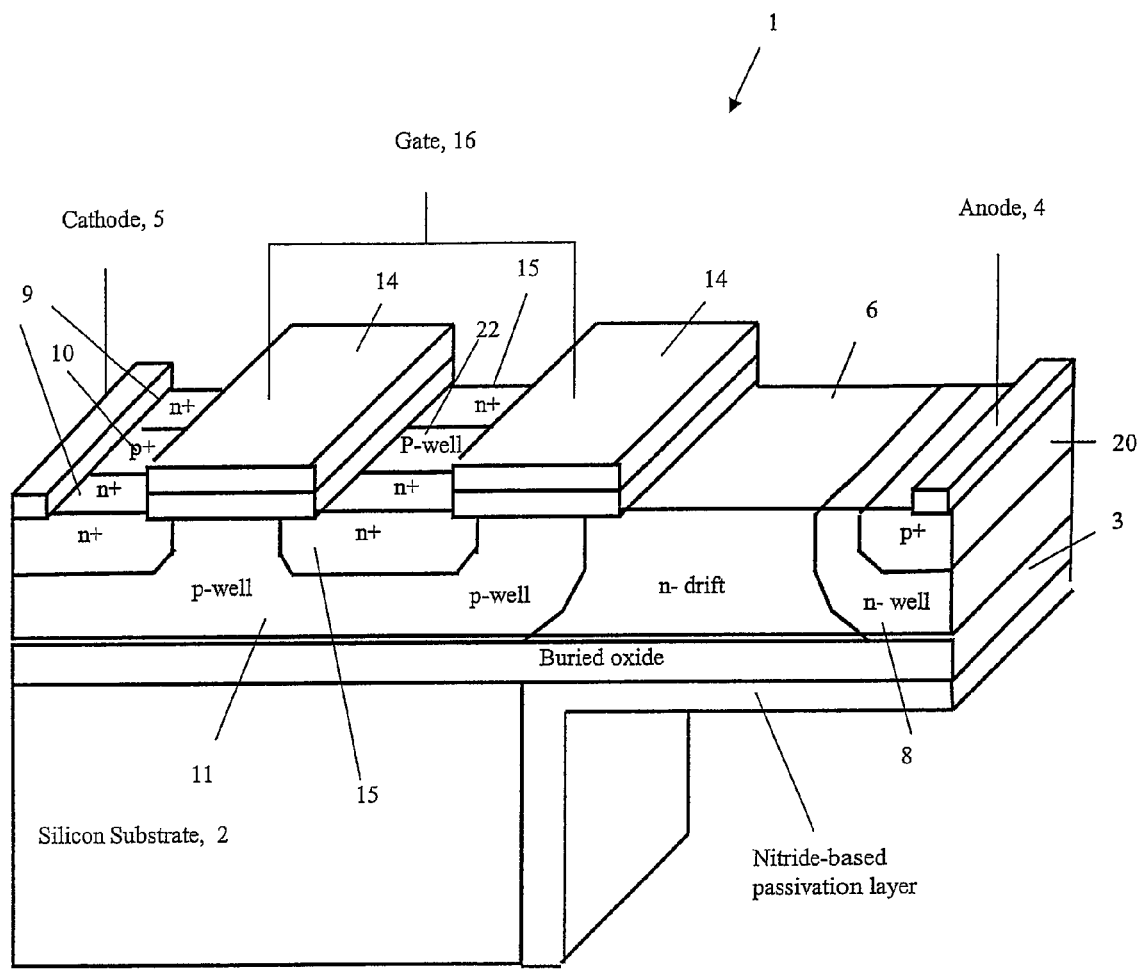
Figure 14:
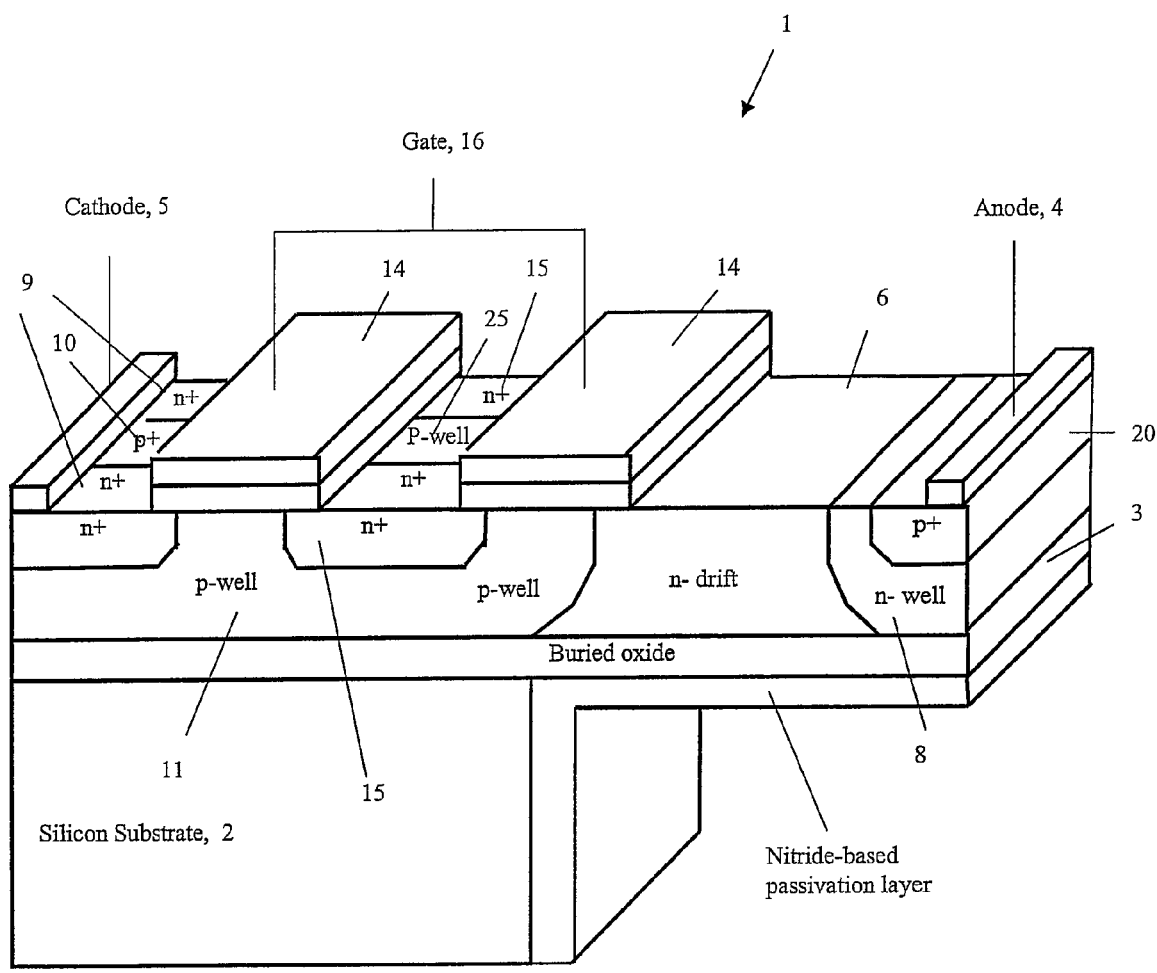
Figure 15:
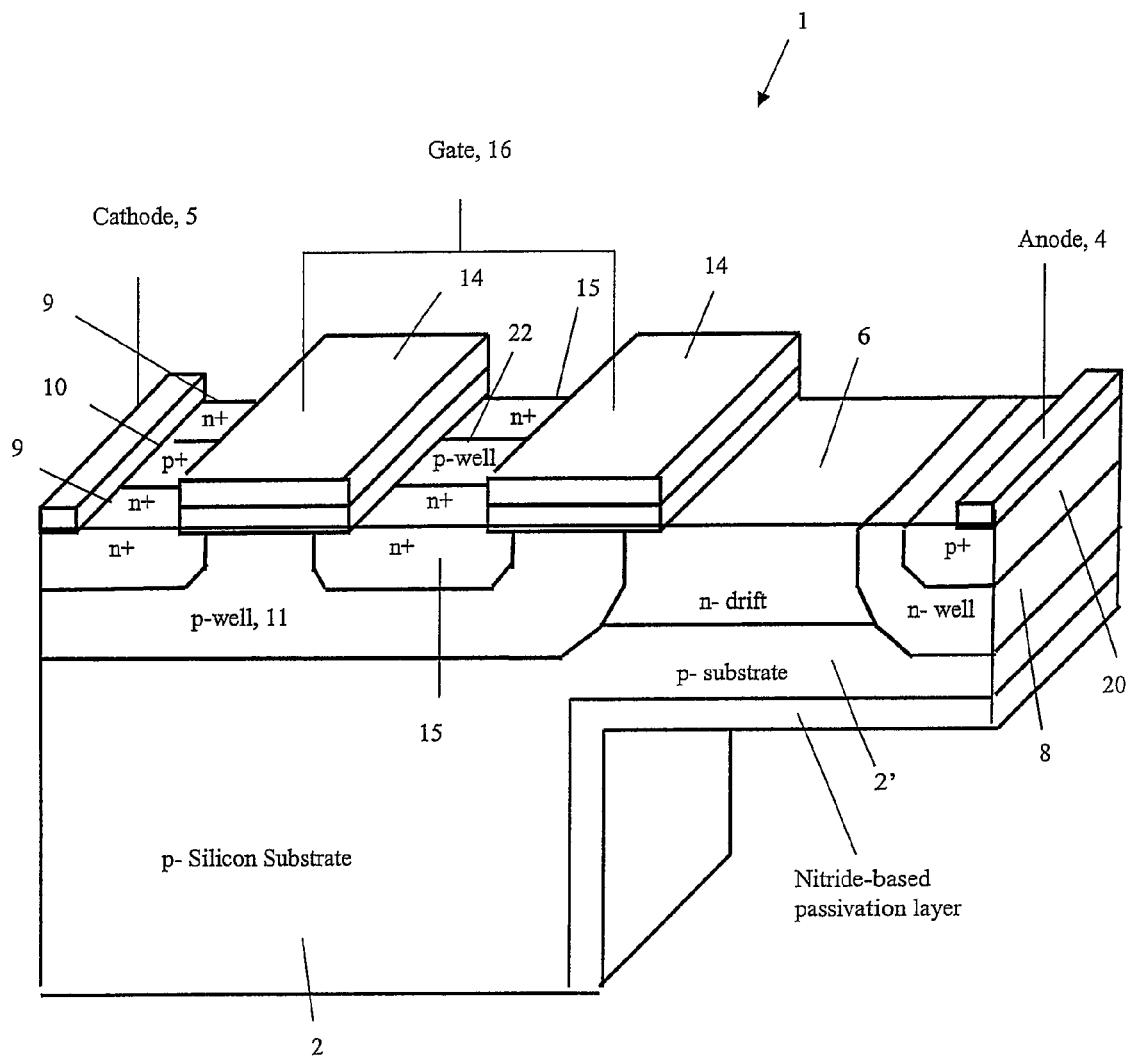
Figure 16:
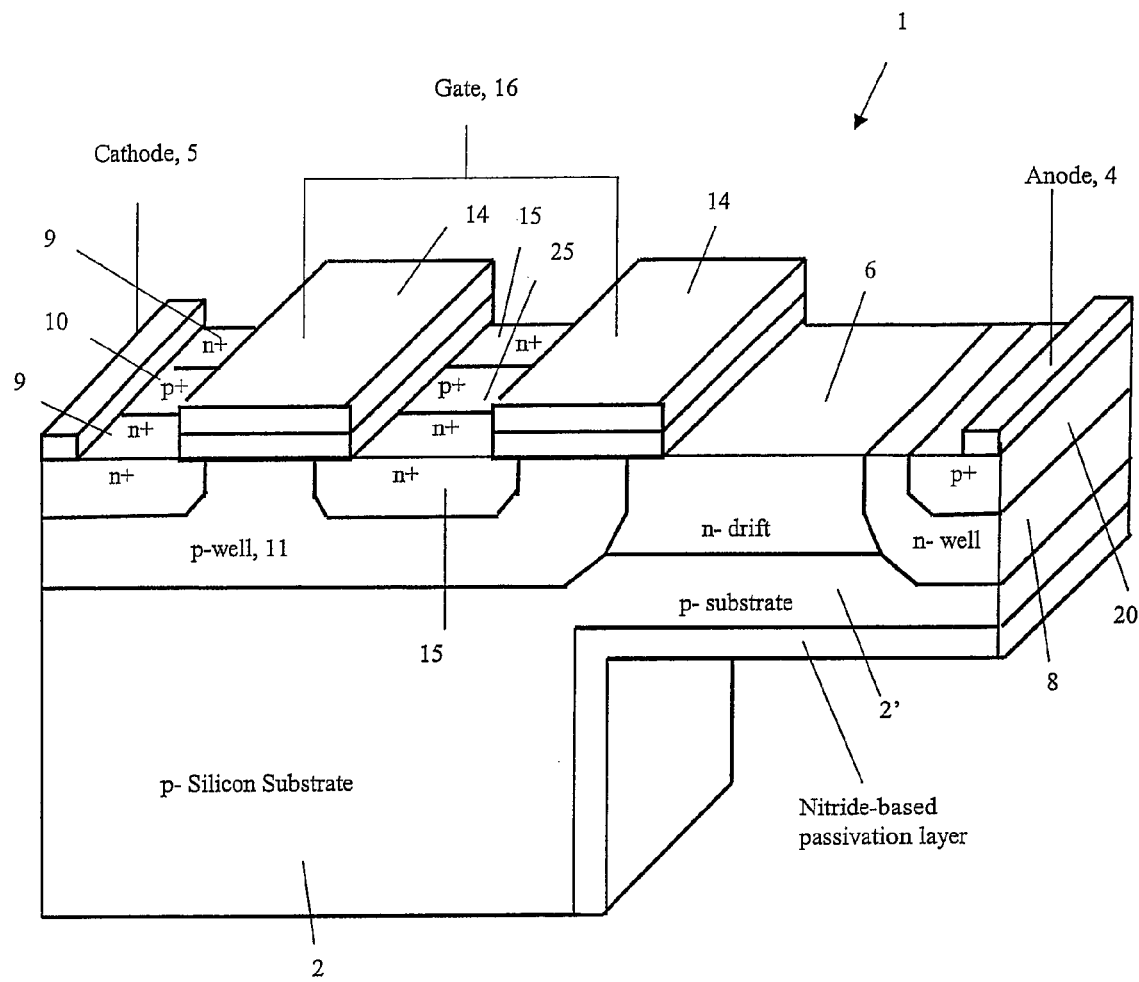
Figure 17:
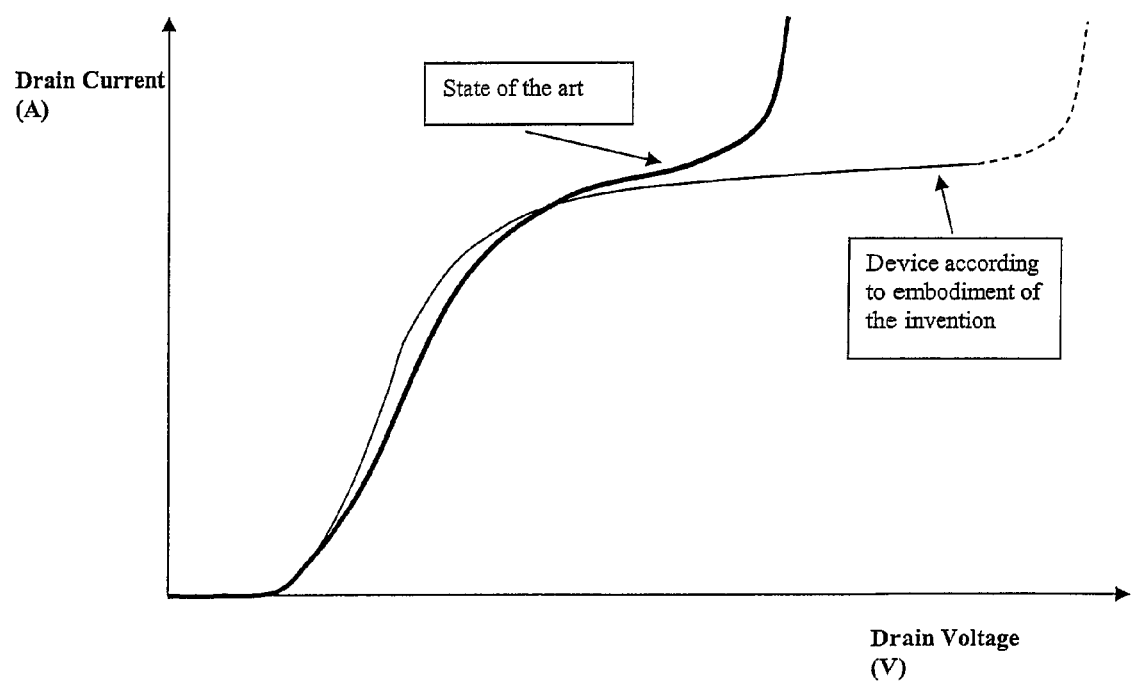

FIG. 6(a) to 6(e) show schematically the successive turning on of the bipolar transistors of the equivalent circuit of FIG. 4;

FIGS. 7 and 8 respectively show schematic cross-sectional views of another example of an LDMOSFET on a substrate and another example of an LIGBT on a substrate according to an embodiment of the present invention, in each case using thin SOI technology;

FIGS. 9 and 10 respectively show schematic cross-sectional views of another example of an LDMOSFET on a substrate and another example of an LIGBT on a substrate according to an embodiment of the present invention, in each case using bulk silicon technology;

FIGS. 11, 13 and 15 show schematic cross-sectional views of further examples of LIGBTs on a substrate using thin SOI technology, thick SOI technology and bulk silicon technology respectively;

FIGS. 12, 14 and 16 show schematic cross-sectional views of further examples of LIGBTs on a substrate using thin SOI technology, thick SOI technology and bulk silicon technology respectively; and, FIG. 17 shows I-V (current v. voltage) data for an example of an LIGBT according to an embodiment of the present invention and a state-of-the-art membrane device.

Embodiments of the present invention will be principally described with reference to its application to LIGBTs and LDMOSFETs, though the person skilled in the art will understand that the present invention can be applied to other power devices. The basic structure and operation of LIGBTs and LDMOSFETs are in themselves well known and will therefore not be described in detail herein.

Figure 1:
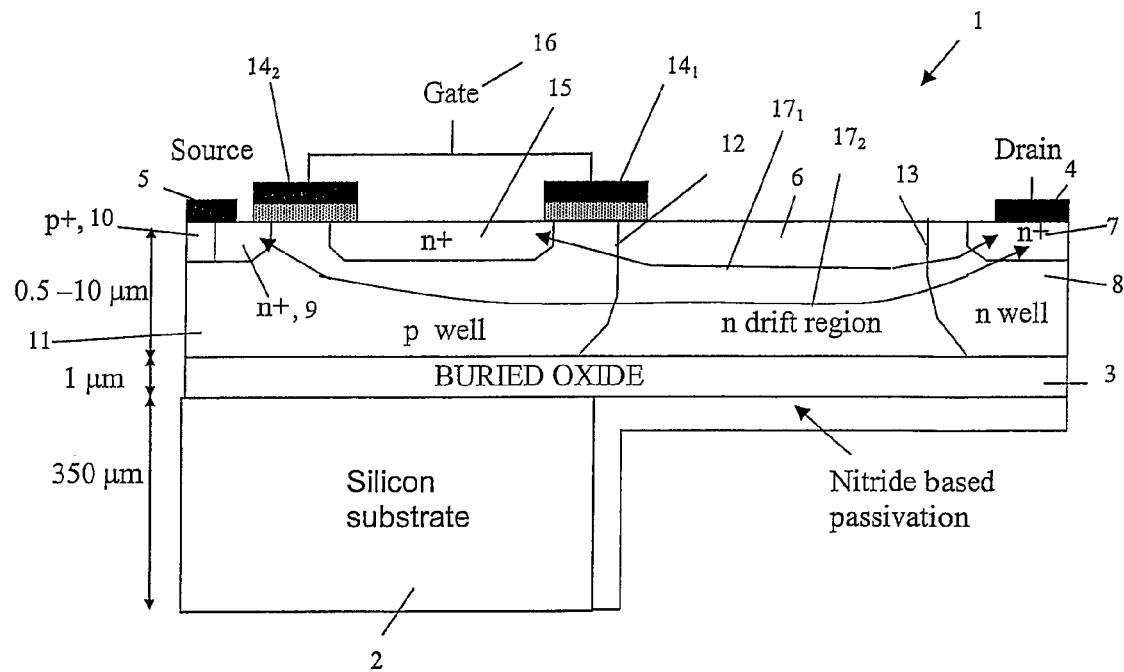
FIG. 1 is a schematic cross-sectional view of an example of an LDMOSFET on a substrate according to an embodiment of the present invention.

Referring first to FIG. 1, there is shown schematically in cross section an LDMOSFET 1 on a silicon substrate 2. In this example, SOI technology is used so the LDMOSFET 1 is placed on a buried silicon oxide layer 3. The LDMOSFET has a drain terminal 4, which is the high voltage terminal, and a source terminal 5, which is the low voltage terminal. A drift region 6 is positioned generally between the drain and source terminals 4,5. In this example, the drift region 6 is lowly doped n type. Accordingly, for the LDMOSFET arrangement, there is provided a highly doped n+ type region 7 under the drain terminal 4. In this example, the n+ drain region 7 is formed in a lowly doped n well 8. Similarly, and again as is well known in LDMOSFETs per se, highly doped n+ and p+ regions 9,10 are positioned adjacent each other under the source terminal 5 and, in this example, in a lowly doped p-well 11. The p-well 11 abuts a first edge 12 of the drift region 6 and the n-well 8 abuts a second edge 13 of the drift region 6. The p-well 11 and the drift region 6 in operation form a reverse-biased junction, which in the blocking mode supports the voltage across the main terminals 4,5. The p-well 11 is intended to protect the device 1 against punch-through during the blocking mode (i.e. the depletion region developed in the p-well 11 at breakdown is smaller than the length of the p-well 11). At the surface of the p-well 11 a channel (i.e. inversion layer) is formed when the MOS gates $14_1$ and $14_2$ are active.

As explained above, the so-called membrane technology disclosed in our U.S. Pat. No. 6,703,684, WO-A-02/25700 and related patents and patent applications, in which the whole or a part of the drift region of a power device is located in or on a thin membrane, has a number of advantages. In the context of lateral devices, a particular advantage is that the electric potential lines in the drift region or the part of the drift region on the membrane tend to spread more uniformly across the width of the drift region, which leads to a higher breakdown voltage. In the example shown in FIG. 1, the entirety of the drift region 6 is placed on a membrane such that there is no substrate below the drift region 6. In contrast, for example, it can be seen that a relatively thick portion of substrate 2 is positioned generally under the source terminal 5 and the p-well 11. In the example shown, the thick portion of the substrate 2 has a depth of about 350 µm, the buried oxide layer 3 has a thickness of about 1 µm, and the thickness of the device 1 itself is in the range 0.5 to 10 µm, such as 5 µm.

As is known per se, a single MOS gate is used to control the operation of conventional LDMOSFETs. However, in accordance with the present invention, the example of an LDMOSFET 1 as shown in FIG. 1 has plural MOS gates $14_1$ this particular example having two MOS gates 14 separated laterally of the device 1. One of the MOS gates $14_1$ is closer to the drain terminal 4 and the other MOS gate $14_2$ is closer to the source terminal 5. The first MOS gate $14_1$ is placed over the edge 12 of the drift region 6 adjacent the p-well 11 so that this first MOS gate $14_1$ extends partly over the drift region 6 and partly over the p-well 11. The other MOS gate $14_2$ is positioned partly over the p-well 11 and the n+ source region 9. Moreover, a highly doped n+ region 15 is formed in the surface of the p-well 11 between the MOS gates 14 so that each MOS gate 14 extends partly over the n+ region 15 in the surface of the p-well 11. In effect, during operation the two MOS gates 14 are electrically connected to each other in series via the n+ region 15. In operation, it is in general preferred to apply the same voltage to each of the MOS gates 14 and this is conveniently provided by connecting the MOS gates 14 to a single common gate terminal 16.

The lateral extent of the MOS gates 14 (i.e. as measured in the direction between the drain and source terminals 4,5) is preferably the same as or very close to the length of the MOS gate that would conventionally have been provided in an LDMOSFET. For example, if the length of the MOS gate in a conventional LDMOSFET were 1.5 μm, then, in one example, the first MOS gate $14_1$ may have a length of 0.5 μm and the other MOS gate $14_2$ may have a length of 1 μm. It should be noted that the lateral extent of the n+ region 15 which effectively connects the MOS gates 14 is preferably much longer than the (combined) width of the MOS gates 14 and is preferably at least three times greater and up to twenty times greater or more. In one example, the n+ region 15 connecting the MOS gates 14 may have a length as measured in the direction between the drain and source terminals 4,5 in the range 5 to 20 microns. Owing to its high doping, its electrical resistance is much less than and practically negligible compared to the electrical resistance of the channels that are formed in use in the p-well 11 under the MOS gates 14.

As mentioned in the introduction above, those parts of the device 1 that are placed on the membrane (that is, the portion of the device 1 below which there is no or only a thin portion of semiconductor substrate) tend to run hotter than otherwise because there is no substrate to act as an effective medium for conducting heat away from those parts. In the LDMOSFET 1 shown in FIG. 1, this means that the first MOS gate $14_1$ which is over the first edge 12 of the drift region will tend to run somewhat hotter than the other MOS gate $14_2$ which is closer to the source terminal 5 and is positioned over the thick portion of the substrate 2.

As is well known per se, the arrangement of the various doped regions in an LDMOSFET means that there is in effect an intrinsic, parasitic bipolar transistor which is formed parallel to the channel that is formed under the MOS gate in operation. (In the case of the well being p-type (i.e. a p-well), the parasitic transistor in npn.) Under normal conditions, this parasitic transistor is inactive. However, if turned on, this parasitic bipolar transistor allows a large portion of the electron current to flow through the bipolar transistor and thus largely bypass the channel formed under the MOS gate. This limits (i.e. lowers) the effective breakdown voltage that can be achieved with the device because it lowers the voltage that can be supported by the device in the voltage blocking mode. This effect is exacerbated when the channel formed under the MOS gate is at higher temperatures because this lowers the effective potential barrier of the base-emitter junction of the parasitic transistor, making activation of the parasitic transistor more likely (under the same conditions of course, including such things as the current density and drain voltage, etc.).

In the device 1 of FIG. 1, the presence of the two MOS gates $14_1$,$14_2$ means that there are in effect two corresponding parasitic transistors $17_1$,$17_2$. Under normal conditions, these parasitic transistors $17_1$,$17_2$ are inactive. In operation of the device 1, even if the first MOS gate $14_1$ becomes hot enough to trigger the first parasitic transistor $17_1$, the second MOS gate $14_2$ runs cooler and therefore, at least at the time that the first transistor $17_1$ is triggered, this second MOS gate $14_2$ still retains control over the operation of the device 1 and its parasitic transistor $17_2$ is not activated. In addition, the effective base of the second parasitic bipolar transistor $17_2$ is much larger than that of the first bipolar transistor $17_1$. As a result, the current gain of the second bipolar transistor $17_2$ is very significantly smaller (e.g. at least one order of magnitude less) than that of the first bipolar transistor $17_1$. This means that the likelihood of the second bipolar transistor $17_2$ turning on is much smaller than that of the first transistor $17_1$. In effect, the first MOS gate $14_1$ "protects" or "shields" the second MOS gate $14_2$ against the loss of gate control. This is achieved without having to increase the length of the drift region 6 and without having to increase the number (or the ratio of the areas) of p+/n+ shorted regions 10,9 at the source 5. It will be understood that, eventually, at sufficiently high voltages applied to the drain terminal 4 and with sufficiently high current densities flowing through the device 1, and moreover owing to increasing temperature during operation of the device 1, the second parasitic transistor $17_2$ acting in parallel with the second MOS gate $14_2$ may trigger. However, this occurs at higher voltages/current densities/temperatures than would otherwise be possible, and thus the immunity of the device 1 against parasitic triggering of bipolar transistors is increased and the safe operating area of the device 1 is extended. Finally, the first MOS gate $14_1$ is also exposed to the largest voltage drop which is developed by the hole current flowing under it in the p-well 11, this hole current being formed by impact ionisation due to high electric fields at the junction between the p-well 11 and the drift region 6 in the LDMOSFET device 1. On the other hand, by locating the second MOS gate $14_2$ further from the junction 12 between the p-well 11 and the drift region 6, the second MOS gate $14_2$ is not exposed to such high voltages, again lowering the risk that the parasitic transistor $17_2$ associated with the second MOS gate $14_2$ will be triggered.

Figure 2:
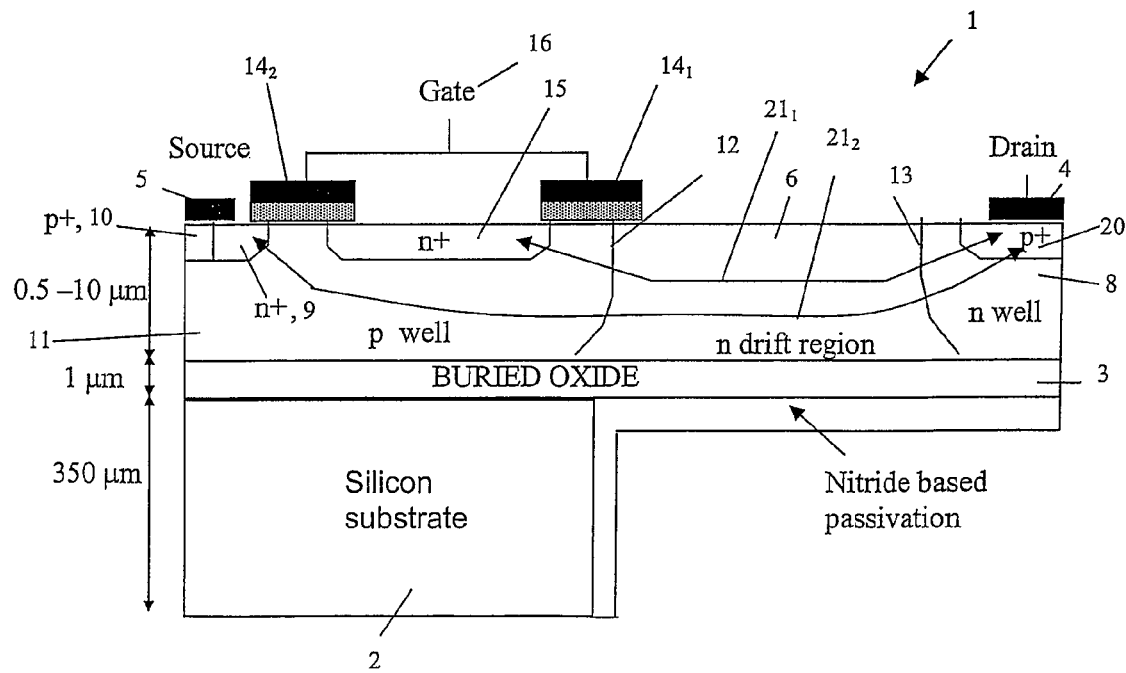
FIG. 2 is a schematic cross-sectional view of an example of an LIGBT on a substrate according to an embodiment of the present invention.

FIG. 2 shows schematically a cross-section through an example of an LIGBT device 1 according to an embodiment of the present invention. Those parts of the LIGBT 1 that correspond to the LDMOSFET 1 of FIG. 1 have the same reference numerals and will not be further described. As is known per se, the main difference in construction between an LDMOSFET and an LIGBT is that the n+ region 7 under the drain 4 of an LDMOSFET 1 is replaced by a p+ injector region 20 under the anode/drain 4 (in a device 1 having an n type drift region 6).

As is known per se, this arrangement in an LIGBT results in a parasitic thyristor between the cathode end and the anode end of the device which, when triggered, results in latch-up of the device, resulting in breakdown during operation In the device 1 of FIG. 2, there are in effect two corresponding parasitic thyristors $21_1$,$21_2$ associated with the parasitic bipolar transistors underneath the gates $14_1$,$14_2$ respectively. Under normal conditions, these parasitic thyristors $21_1$,$21_2$ are inactive. In operation of the device 1, even if the first MOS gate $14_1$ becomes hot enough to trigger the first parasitic thyristor $21_1$, the second MOS gate $14_2$ runs cooler and therefore, at least at the time that the first thyristor $21_1$ is triggered, this second MOS gate $14_2$ still retains control over the operation of the device 1 and its parasitic thyristor $21_2$ is not activated. In addition the effective base of the parasitic bipolar transistor under the gate $14_2$ is much larger than that of the bipolar transistor under the gate $14_1$. As a result, the current gain of the bipolar transistor under the gate $14_2$ is very significantly smaller (e.g. at least one order of magnitude less) than that of the bipolar transistor under the gate $14_1$. Since the triggering of the thyristors $21_1$ and $21_2$ are effectively given by the increase in the gain of these bipolar transistors, this means that the likelihood of the second thyristor $21_2$ turning on is much smaller than that of the first thyristor $21_1$. In effect, the first MOS gate $14_1$ "protects" or "shields" the second MOS gate $14_2$ against the loss of gate control (i.e. latch-up). This is achieved without having to increase the length of the drift region 6 and without having to increase the number (or the ratio of the areas) of p+/n+ shorted regions 10,9 at the cathode 5. It will be understood that, eventually, at sufficiently high voltages applied to the anode terminal 4 and with sufficiently high current densities flowing through the device 1, and moreover owing to increasing temperature during operation of the device 1, the second parasitic thyristor $21_2$ acting in parallel with the second MOS gate $14_2$ may trigger. However, this occurs at higher voltages/current densities/temperatures than would otherwise be possible, and thus the immunity of the device 1 to latch-up is increased and the safe operating area of the device 1 is extended. In addition, the first MOS gate $14_1$ is also exposed to the largest voltage drop which is developed by the hole current flowing under it in the p-well 11, this hole current being provided directly by the p+ anode region 20 in the LIGBT device 1. On the other hand, by locating the second MOS gate $14_2$ further from the junction 12 between the p-well 11 and the drift region 6, the second MOS gate $14_2$ is not exposed to such high voltages, again lowering the risk that the parasitic thyristor $21_2$ associated with the bipolar transistor under the second MOS gate $14_2$ will be triggered.

During the on-state operation of the LIGBT 1 of FIG. 2, the two MOS gates $14_1,14_2$ are biased positively with respect to the source 5, which causes inversion layers (i.e. channels) to form at the surface of the p-well 11. This allows an electron current to flow into the n-drift region 6, which serves as the base current for a pnp transistor which is formed between p+ anode 20 (emitter), the n-well 8 and the n-drift region 6 (base), and the p-well 11 (collector). The action of this pnp transistor at high level injection results in conductivity modulation of the n-drift region 6 and as a result a lowering of the equivalent on-resistance of the drift region 6. The hole current flows through the p-well 11, under the channel under the first MOS gate $14_1$, under the n+ "connector" region 15, under the channel under the second MOS gate $14_2$, and under the n+ source diffusion 9 to the p+ source contact region 10. If the hole current develops a voltage of 0.7 V across its path in the p-well 11, then the npn transistor formed by the n+ connector region 15 (emitter), the p-well 11 (base) and the n-drift region 6 (collector) may be triggered leading to additional injection of electrons in the drift region 6 and as a result further modulation of the drift region 6. This results in better on-state (owing to the lower electrical on-state resistance) and most of the electron current will flow directly through this npn transistor rather than the channel under the first MOS gate $14_1$. This effect is even more pronounced at higher temperatures as the junction voltage (0.7 V at room temperature) is significantly reduced (e.g. to approximately 0.5 V at 150° C.). However it is important to note that, even if that happens, the junction between the n+ source diffusion 9 and the p-well 11 is still not forward-biased. This is because this junction is less exposed to high potentials in the p-well 11 and the fact that this region, where the second MOS channel is located, is cooler as it over the thick portion of the substrate and further away from the high temperature gradients induced by the presence of the "membrane", i.e. the portion where there is no substrate or only a thin portion of substrate.

Figure 3:
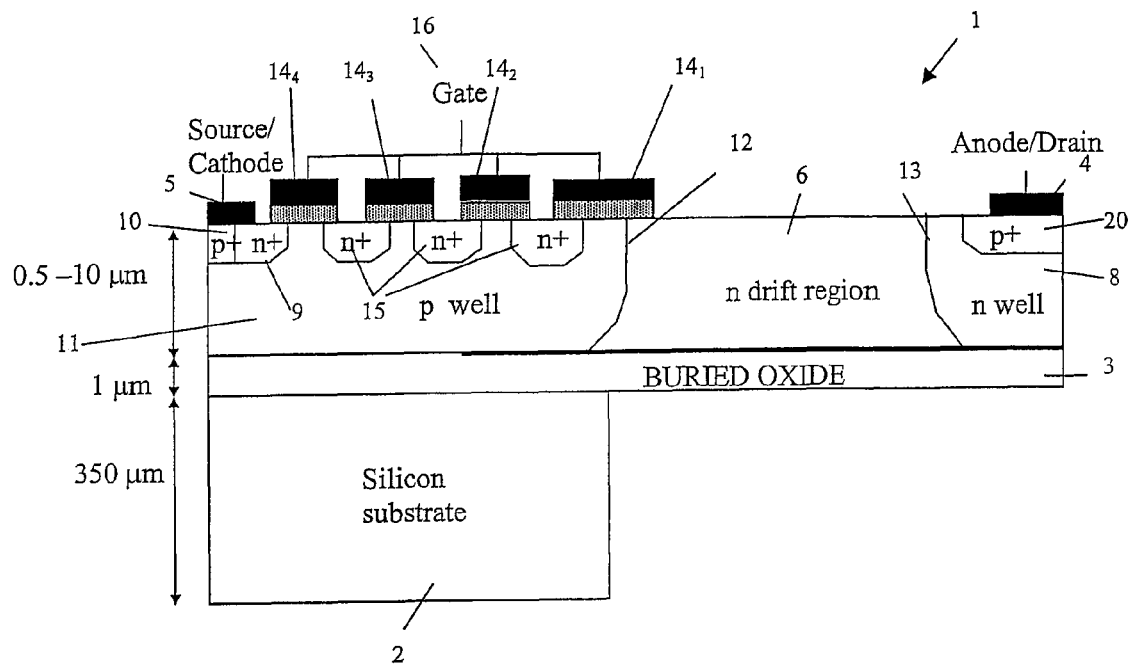
FIG. 3 is a schematic cross-sectional view of a second example of an LIGBT on a substrate according to an embodiment of the present invention.

More than two MOS gates $14_1,14_2$ may be provided, each successively closer to the low voltage terminal 5 and connected in pairs by respective highly doped regions 15. An example in the context of an LIGBT 1 is shown in FIG. 3. This is similar to the device 1 shown in FIG. 1 but instead of two MOS gates $14_1,14_2$ and their respective channels, several (here, four) MOS gates $14_1, \ldots 14_n$ are present, each offering a "gradual" protection against latch-up.

Figure 5:
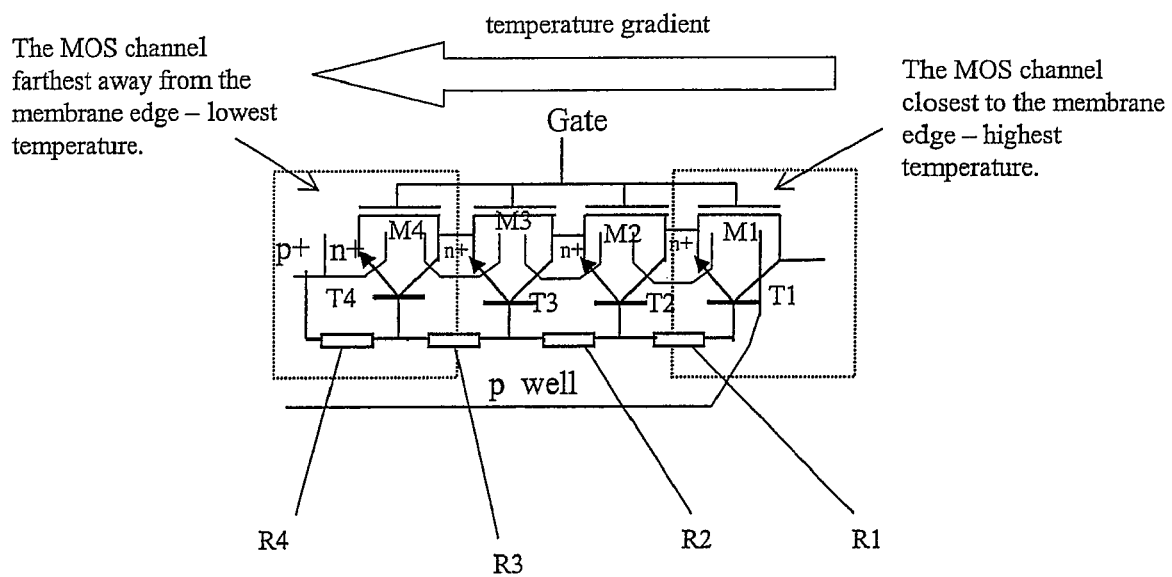
FIG. 5 shows schematically in more detail the equivalent circuit of FIG. 4 and the temperature gradient across MOS channels of the device.

FIG. 4 shows the device 1 of FIG. 3 and the equivalent circuit of the network of parasitic npn transistors T1-T4 and the distributed lateral p-well resistors R1-R4 linking the bases of these npn transistors T1-T4. FIG. 5 shows the equivalent circuit of the MOS components of the device 1 of FIGS. 3 and 4 in more detail, which includes the series ideal MOSFETs M1-M4 and the parasitic parallel npn bipolar transistors T1-T4. The bases of the npn transistors T1-T4 are connected via the distributed lateral p-well resistances R1-R4. The typical temperature gradient during operation is indicated with temperature being highest for the transistor T1 closest to the edge of the membrane.

Figure 6A:
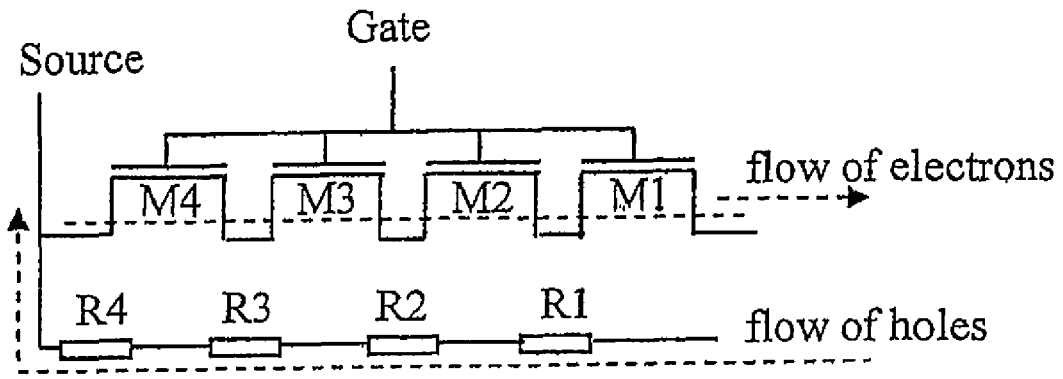
Figure 6B:
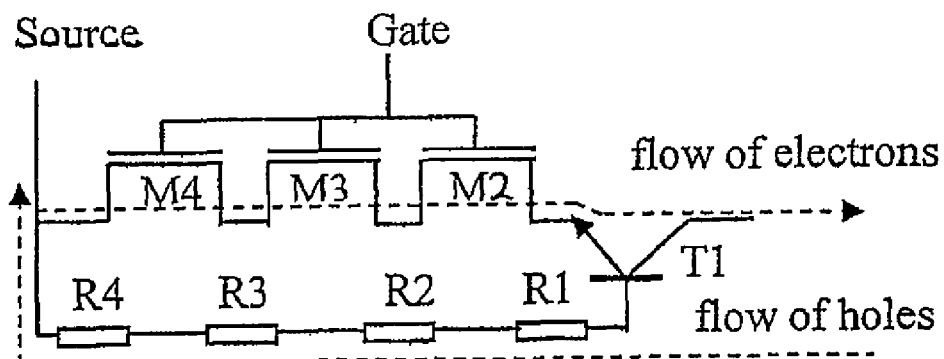
Figure 6C:
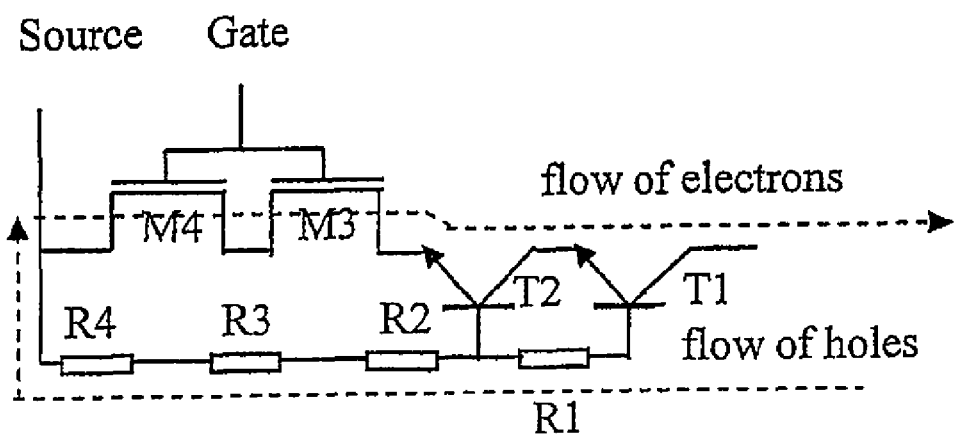
Figure 6D:
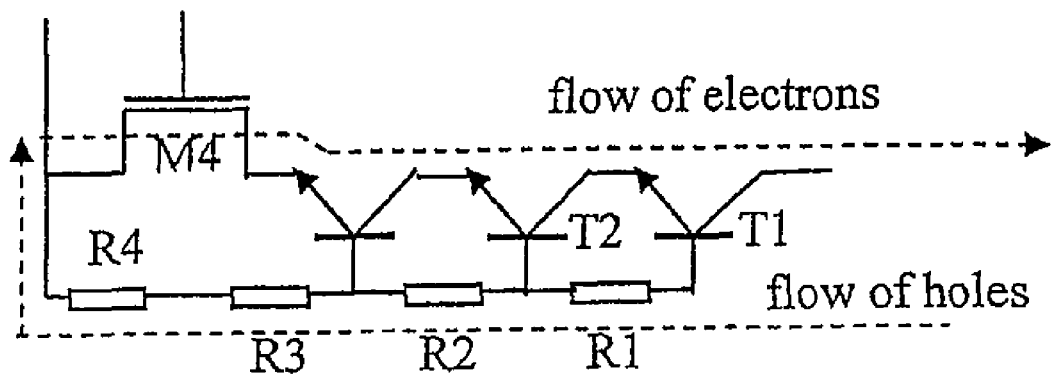
Figure 6E:
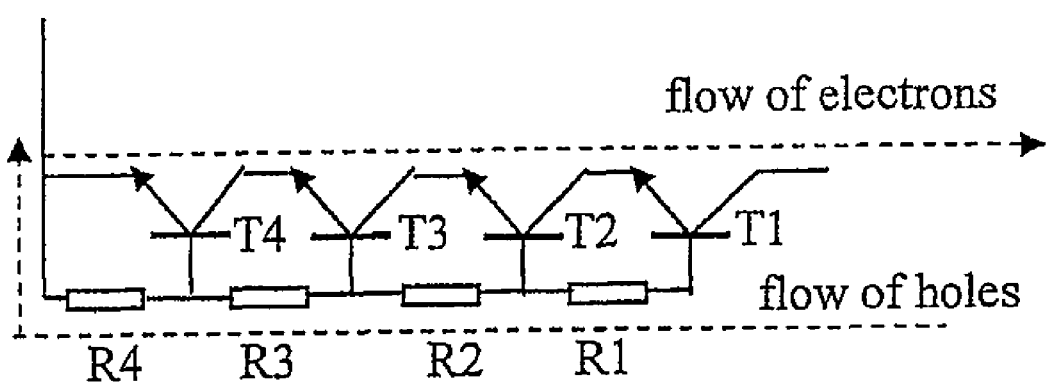

FIGS. 6(a) to 6(e) show the sequence of successive turning-on of the series parasitic npn transistors T1-T4 as higher voltages/higher currents are applied to the device 1 of FIGS. 3 and 4. In FIG. 6(a), no parasitic transistors are turned-on and current flows serially through the MOS channels M1 to M4 formed in use under the MOS gates $14_1$-$14_4$. In FIG. 6(b), the first transistor T1 is active, in effect "stealing" the electron current from the first MOS channel M1. In FIG. 6(c), the first and second transistors T1,T2 are active, "stealing" the electron current from first and second MOS channels M1,M2 respectively. In FIG. 6(d), the first to third transistors T1, T2 and T3 are active, stealing the electron current from the first to third MOS channels M1,M2,M3 respectively. In FIG. 6(e), latch-up occurs as none of the MOS channels is active and therefore the electron current can no longer be controlled by the gate terminal. It may be noted that the parasitic transistors T1-T4 are coupled in a positive feedback with the pnp transistor (not shown here) to form a thyristor.

FIGS. 7 and 8 show respectively examples of an LDMOSFET 1 and an LIGBT 1 similar to those shown in FIGS. 1 and 2 except that these examples are formed using thin SOI technology. Here the thickness of the silicon layer above the buried oxide layer 3 is typically only 0.2 to 0.5 microns. Accordingly, the n+ drain region 7 and p+ anode region 20 of the LDMOSFET and LIGBT 1 respectively, the p+ and n+ source/cathode regions 10,9 of the LDMOSFET and LIGBT 1 respectively, and the n+ connector region 15 are likely to diffuse all the way from the top surface of the device 1 to the buried oxide layer 3.

FIGS. 9 and 10 show respectively examples of an LDMOSFET 1 and an LIGBT 1 similar to those shown in FIGS. 1 and 2 and FIGS. 7 and 8 except that these examples are formed using bulk silicon technology. In this case, there is no buried oxide layer and the etch to remove substrate under the drift region 6 and drain/anode 4 is controlled carefully so as to leave a thin portion 2' of substrate 2 under the drift region 6 and drain/anode 4. The substrate 2 in these examples is ideally lowly doped so that a depletion region can be formed during the blocking mode in the thin p-portion 2' of the substrate 2 below the n-drift region 6.

FIGS. 11 to 16 show schematically three dimensional views of LIGBTs 1 similar to those described above. The examples of FIGS. 11 and 12 use "thin" SOI technology, the examples of FIGS. 13 and 14 use "thick" SOI technology, and the examples of FIGS. 15 and 16 use bulk silicon technology.

In the examples of FIGS. 11, 13 and 15, plural n+ connector stripes 15 are used between the channels under the MOS gates 14. A respective relatively lowly doped p-well 22 is provided between and parallel to each pair of the plural n+ connector stripes 15. The p-well(s) 22 also connect the channels under the two MOS gates 14. (In the drawings, only two connector stripes 15 and hence only one well 22 between them are shown. A great number of connector stripes 15 and accordingly lowly doped wells 22 of the opposite conductivity type between them may be used.) Given the relatively high resistance of the p-wells 22, it is likely that, during the on-state operation, the n+ connectors stripes 15 can become electron emitters (i.e. the npn parasitic transistors formed between the n+ connector stripes 15 (emitters), the p-well 11 (base) and the n-drift region 6 (collector) are turned-on). This is similar in effect to the arrangement achieved in the EST devices referred to above. The additional electron injection leads to higher conductivity modulation and as a result lower on-state voltage drop.

In the examples of FIGS. 12, 14 and 16, plural n+ connector stripes 15 are again used between the channels under the MOS gates 14. In these examples, however, a respective relatively highly doped p+ stripe 25 is positioned between each pair of n+ connector stripes 15. The relatively highly doped p+ stripe(s) 25 also connect the channels under the two MOS gates 14. (In the drawings, only two connector stripes 15 and hence only one relatively highly doped stripe 25 between them are shown. A great number of connector stripes 15 and accordingly relatively highly doped stripes 25 of the opposite conductivity type between them may be used.) The relatively highly doped p+ stripe(s) 25 can be and preferably are fabricated at the same time as the p+ anode layer 20. These relatively highly doped p+ stripe(s) 25 provide a very low electrical resistance for the holes to be removed from the drift region 6 to the source p+/n+ shorts 10,9. Thus it is likely that the potential drop developed by the hole current on these layers would remain low (well under 0.7 V) and thus not forward-bias the junction between the n+ connector/p well 15,11 under normal on-state operating conditions. Thus, the n+ connectors 15 in these embodiments are not used as emitters, but only channel connectors. Nevertheless, the use of a colder MOS channel and no forward-biasing of the connectors give a good safe operating area with still better on-state performance than a conventional membrane LIGBT.

FIG. 17 shows schematically the I-V characteristics of an example of an LIGBT device 1 according to an embodiment of the present invention against a state-of-the-art membrane power device. The device 1 according to the embodiment of the present invention shows a better FBSOA (Forward Biased Safe Operating Area) as it can support higher voltages and currents before occurrence of latch-up, which is indicated by a kink in the characteristic curve. On the other hand, the state-of-the-art membrane device shows worse latch-up characteristics and still lower on-state performance.

In each of the examples of devices according to the present invention, a nitride-based or other suitable passivation later (shown schematically in some of the figures) may be provided under the buried oxide layer 3 for those devices using SOI technology and under the thin portion 2' of the substrate for those using bulk silicon technology, in each case the passivation layer extending over the adjacent "vertical" wall of the thick portion of the substrate 2.

Embodiments of the present invention have been described with particular reference to the examples illustrated. However, it will be appreciated that variations and modifications may be made to the examples described within the scope of the present invention.

The invention claimed is:

1. A power semiconductor device on a semiconductor substrate, the device having a top surface and an opposed bottom surface below a part of which is a relatively thick portion of the semiconductor substrate,
   the power semiconductor device having a drift region which is relatively lowly doped, at least a portion of the drift region having either no semiconductor substrate positioned thereunder or a relatively thin portion of the semiconductor substrate thereunder, wherein the relatively thick portion of the substrate is thicker than the relatively thin portion of the substrate,
   the top surface of the device having a high voltage terminal and a low voltage terminal connected directly or indirectly thereto to allow a voltage to be applied laterally across the drift region, wherein the voltage applied to the high voltage terminal is higher than the voltage applied to the low voltage terminal,
   the drift region having a first edge located proximate the low voltage terminal and a second edge located proximate the high voltage terminal,
   the device having at least two MOS (metal-oxide-semiconductor) gates on the top surface of the device for controlling current level in the device during on-state of the device and for controlling switching of the device, wherein a first of the MOS gates is located over the first edge of the drift region and in contact with the drift region and a second of the MOS gates is located over the relatively thick portion of the substrate, on the opposite side of the first MOS gate to the drift region, and between the low voltage terminal and the first MOS gate, wherein inversion layer channels are formed under said first and second MOS gates on operation of said first and second MOS gates,
   the device having at least one relatively highly doped region at its top surface extending between and in contact with said first and second MOS gates, wherein if the inversion layer channels are electron channels then the or each relatively highly doped region is n type and if the inversion layer channels are hole channels then the or each relatively highly doped region is p type, wherein the relatively highly doped region is more highly doped than the relatively lowly doped region.

2. A power semiconductor device according to claim 1, comprising a single gate terminal connected to said first and second MOS gates for allowing the same gate voltage to be applied simultaneously to said first and second MOS gates.

3. A power semiconductor device according to claim 1, comprising a further doped region at the top surface of the device between and in contact with said first and second MOS gates, the further doped region being of the opposite conductivity type to the relatively highly doped region that extends between said first and second MOS gates.

4. A power semiconductor device according to claim 3, comprising a second relatively highly doped region at the top surface of the device between and in contact with said first and second MOS gates, said further relatively highly doped region being of the same conductivity type as the first relatively highly doped region that extends between said first and second MOS gates, said further doped region of the opposite conductivity type being positioned between the first and second relatively highly doped regions that extend between said first and second MOS gates.

5. A power semiconductor device according to claim 1, wherein said portion of the drift region has no semiconductor substrate positioned thereunder, and comprising an electrically insulating layer between said part of the device and said relatively thick portion of the semiconductor substrate and under said at least a portion of the drift region.

6. A power semiconductor device according to claim 1, wherein the drift region and the relatively highly doped region that extends between said first and second MOS gates are each doped with a first conductivity type, and comprising a well of the second conductivity type, the relatively highly doped region that extends between said first and second MOS gates being provided in the well, the well extending to the top surface of the device under the MOS gates and extending to the first edge of the drift region.

7. A power semiconductor device according to claim 1, wherein the device is an LDMOSFET (lateral diffusion MOS transistor), and wherein the drift region and the relatively highly doped region that extends between said first and second MOS gates are each doped with a first conductivity type, and comprising a relatively highly doped region of the first conductivity type under the high voltage terminal, a relatively highly doped region of the first conductivity type under the low voltage terminal, a relatively highly doped region of the second conductivity type under the low voltage terminal, and a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

8. A power semiconductor device according to claim 1, wherein the device is an LIGBT (lateral insulated gate bipolar transistor), and wherein the drift region and the relatively highly doped region that extends between said first and second MOS gates are each doped with a first conductivity type, and comprising a relatively highly doped region of the second conductivity type under the high voltage terminal, a relatively highly doped region of the first conductivity type under the low voltage terminal, a relatively highly doped region of the second conductivity type under the low voltage terminal, and a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

9. A method of forming a power semiconductor device on a semiconductor substrate, the device having a top surface and an opposed bottom surface below a part of which is a relatively thick portion of the semiconductor substrate, the method comprising
forming, on the substrate, the power semiconductor device with a drift region which is relatively lowly doped,
removing substrate below at least a portion of the drift region so that said at least a portion of the drift region has either no semiconductor substrate positioned thereunder or a relatively thin portion of the semiconductor substrate thereunder, wherein the relatively thick portion of the substrate is thicker than the relatively thin portion of the substrate,
connecting a high voltage terminal and a low voltage terminal directly or indirectly to the top surface of the device to allow a voltage to be applied laterally across the drift region, wherein the voltage applied to the high voltage terminal is higher than the voltage applied to the low voltage terminal,
the drift region having a first edge located proximate the low voltage terminal and a second edge located proximate the high voltage terminal,
the method further comprising forming at least two MOS (metal-oxide-semiconductor) gates on the top surface of the device for controlling current level in the device during on-state of the device and for controlling switching of the device, wherein a first of the MOS gates is located over the first edge of the drift region and in contact with the drift region and a second of the MOS gates is located over the relatively thick portion of the substrate, on the opposite side of the first MOS gate to the drift region, and between the low voltage terminal and the first MOS gate, and
forming at least one relatively highly doped region at the top surface of the device so as to extend between and in contact with said first and second MOS gates, wherein inversion layer channels are formed under said first and second MOS gates on operation of said first and second MOS gates, wherein if the inversion layer channels are electron channels then the or each relatively highly doped region is n type and if the inversion layer channels are hole channels then the or each relatively highly doped region is p type, wherein the relatively highly doped region is more highly doped than the relatively lowly doped region.

10. A method according to claim 9, comprising connecting a single gate terminal to said first and second MOS gates for allowing the same gate voltage to be applied simultaneously to said first and second MOS gates.

11. A method according to claim 9, comprising providing a further doped region at the top surface of the device between and in contact with said first and second MOS gates, the further doped region being of the opposite conductivity type to the relatively highly doped region that extends between said first and second MOS gates.

12. A method according to claim 11, comprising providing a second relatively highly doped region at the top surface of the device between and in contact with said first and second MOS gates, said further relatively highly doped region being of the same conductivity type as the first relatively highly doped region that extends between said first and second MOS gates, said further doped region of the opposite conductivity type being positioned between the first and second relatively highly doped regions that extend between said first and second MOS gates.

13. A method according to claim 9, wherein the removing of the substrate leaves said portion of the drift region with no semiconductor substrate positioned thereunder, and comprising forming an electrically insulating layer between said part of the device and said relatively thick portion of the semiconductor substrate and under said at least a portion of the drift region.

14. A method according to claim 9, wherein the drift region and the relatively highly doped region that extends between said first and second MOS gates are each doped with a first conductivity type, and comprising forming a well of the second conductivity type, the relatively highly doped region that extends between said first and second MOS gates being provided in the well, the well extending to the top surface of the device under the MOS gates and extending to the first edge of the drift region.

15. A method according to claim 9, wherein the device is an LDMOSFET (lateral diffusion MOS transistor), and wherein the drift region and the relatively highly doped region that extends between said first and second MOS gates are each doped with a first conductivity type, and comprising forming a relatively highly doped region of the first conductivity type under the high voltage terminal, forming a relatively highly doped region of the first conductivity type under the low voltage terminal, forming a relatively highly doped region of the second conductivity type under the low voltage terminal, and forming a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

16. A method according to claim 15, wherein the relatively highly doped region that extends between said first and second MOS gates is formed in the same fabrication step as at least one of the relatively highly doped region of the first conductivity type under the high voltage terminal and the relatively highly doped region of the first conductivity type under the low voltage terminal.

17. A method according to claim 9, wherein the device is an LIGBT (lateral insulated gate bipolar transistor), and wherein the drift region and the relatively highly doped region that extends between said first and second MOS gates are each doped with a first conductivity type, and comprising forming a relatively highly doped region of the second conductivity type under the high voltage terminal, forming a relatively highly doped region of the first conductivity type under the low voltage terminal, forming a relatively highly doped region of the second conductivity type under the low voltage terminal, and forming a well of the second conductivity type, the relatively highly doped regions of the first and second conductivity type and the relatively highly doped region that extends between said first and second MOS gates being provided in the well, the well extending to the top surface of the device under the MOS gates and extending to the first edge of the drift region.

18. A method according to claim 17, wherein the relatively highly doped region that extends between said first and second MOS gates is formed in the same fabrication step as the relatively highly doped region of the first conductivity type under the low voltage terminal.

* * * * *